(12) United States Patent
Maeda

(10) Patent No.: US 7,855,335 B2
(45) Date of Patent: Dec. 21, 2010

(54) BEAM INTEGRATION FOR CONCENTRATING SOLAR COLLECTOR

(75) Inventor: Patrick Y. Maeda, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1026 days.

(21) Appl. No.: 11/380,374

(22) Filed: Apr. 26, 2006

(65) Prior Publication Data
US 2007/0251568 A1 Nov. 1, 2007

(51) Int. Cl.
*H02N 6/00* (2006.01)
(52) U.S. Cl. ...................................................... 136/246
(58) Field of Classification Search ................. 136/246; 359/362, 364, 365, 366, 851, 853; 126/683, 126/684, 685
See application file for complete search history.

(56) References Cited

U.S. PATENT DOCUMENTS

| | | | |
|---|---|---|---|
| 2,789,731 | A | 4/1957 | Marraffino |
| 3,159,313 | A | 12/1964 | Guilford |
| 3,602,193 | A | 8/1971 | Adams et al. |
| 3,973,994 | A | 8/1976 | Redfield |
| 3,988,166 | A | 10/1976 | Beam |
| 4,018,367 | A | 4/1977 | Morine et al. |
| 4,021,267 | A * | 5/1977 | Dettling .................. 136/246 |
| 4,045,246 | A | 8/1977 | Mlavsky et al. |
| 4,053,327 | A | 10/1977 | Meulenberg, Jr. |
| 4,084,985 | A | 4/1978 | Evans, Jr. |
| 4,086,485 | A | 4/1978 | Kaplow et al. |
| 4,095,997 | A | 6/1978 | Griffiths |
| 4,119,058 | A | 10/1978 | Schmermund |
| 4,131,485 | A | 12/1978 | Meinel et al. |

(Continued)

FOREIGN PATENT DOCUMENTS

CN 2606309 Y 3/2004

(Continued)

OTHER PUBLICATIONS

Akira Terao, "MicroDish: A Novel Reflective Optic For Flat-Plate Micro-Concentrator", SPIE's 49th Annual Meeting, Aug. 2-6, 2004, Denver, Colorado, USA, 9 pgs.

(Continued)

*Primary Examiner*—Jennifer K Michener
*Assistant Examiner*—Matthew T Martin
(74) *Attorney, Agent, or Firm*—Bever, Hoffman & Harms, LLP; Patrick T. Beaver

(57) ABSTRACT

A concentrating solar collector that utilizes a solar collector optical system to concentrate solar light onto a PV cell (image plane), wherein the solar collector optical system includes an array of first optical elements that divide the solar light into separate beams, and a secondary optical system that integrates (superimposes) the separate beams in a defocused state at the image plane, thereby forming a uniform light distribution pattern on the PV cell. The secondary optical system is positioned at a distance from the aperture plane, whereby the rays of each separate beam leaving the secondary optical element are parallel. The image plane (PV cell) is located at the back focal point of the second image element, whereby all of the separate beams are superimposed on the PV cell in a defocused state. Optional intervening third optical elements are used to increase the acceptance angle.

23 Claims, 8 Drawing Sheets

U.S. PATENT DOCUMENTS

| | | | |
|---|---|---|---|
| 4,141,231 A | 2/1979 | Kudlich | |
| 4,148,301 A | 4/1979 | Cluff | |
| 4,153,476 A | 5/1979 | Shelpuk et al. | |
| 4,177,083 A | 12/1979 | Kennedy | |
| 4,221,468 A * | 9/1980 | Macken | 359/346 |
| 4,224,081 A | 9/1980 | Kawamura et al. | |
| 4,234,351 A | 11/1980 | Deminet et al. | |
| 4,254,894 A | 3/1981 | Fetters | |
| 4,320,251 A | 3/1982 | Narasimhan et al. | |
| 4,331,703 A | 5/1982 | Lindmayer | |
| 4,337,758 A * | 7/1982 | Meinel et al. | 126/684 |
| 4,355,196 A | 10/1982 | Chai | |
| 4,461,403 A | 7/1984 | Prahs | |
| 4,540,843 A | 9/1985 | Gochermann et al. | |
| 4,683,348 A | 7/1987 | Pidgeon et al. | |
| 4,711,972 A | 12/1987 | O'Neill | |
| 4,746,370 A | 5/1988 | Woolf | |
| 4,747,517 A | 5/1988 | Hart | |
| 4,792,685 A | 12/1988 | Yamakawa | |
| 4,796,038 A | 1/1989 | Allen et al. | |
| 4,841,946 A | 6/1989 | Marks | |
| 4,847,349 A | 7/1989 | Ohta et al. | |
| 4,849,028 A | 7/1989 | Krause | |
| 4,855,884 A | 8/1989 | Richardson | |
| 4,947,825 A | 8/1990 | Moriarty | |
| 4,952,026 A | 8/1990 | Bellman et al. | |
| 5,004,319 A * | 4/1991 | Smither | 359/570 |
| 5,011,565 A | 4/1991 | Dube et al. | |
| 5,062,899 A | 11/1991 | Kruer | |
| 5,075,281 A | 12/1991 | Testardi | |
| 5,089,055 A | 2/1992 | Nakamura | |
| 5,151,377 A | 9/1992 | Hanoka et al. | |
| 5,167,724 A | 12/1992 | Chiang | |
| 5,180,441 A | 1/1993 | Cornwall et al. | |
| 5,213,628 A | 5/1993 | Noguchi et al. | |
| 5,216,543 A | 6/1993 | Calhoun | |
| 5,254,388 A | 10/1993 | Melby et al. | |
| 5,344,496 A | 9/1994 | Stern et al. | |
| 5,389,159 A | 2/1995 | Kataoka et al. | |
| 5,404,869 A * | 4/1995 | Parkyn et al. | 126/699 |
| 5,501,743 A | 3/1996 | Cherney | |
| 5,529,054 A | 6/1996 | Shoen | |
| 5,536,313 A | 7/1996 | Watanabe et al. | |
| 5,538,563 A | 7/1996 | Finkl | |
| 5,540,216 A | 7/1996 | Rasmusson | |
| 5,543,333 A | 8/1996 | Holdermann | |
| 5,552,820 A * | 9/1996 | Genovese | 347/241 |
| 5,559,677 A | 9/1996 | Errichiello | |
| 5,560,518 A | 10/1996 | Catterall et al. | |
| 5,569,399 A | 10/1996 | Penney et al. | |
| 5,590,818 A | 1/1997 | Raba et al. | |
| 5,665,175 A | 9/1997 | Safir | |
| 5,700,325 A | 12/1997 | Watanabe | |
| 5,873,495 A | 2/1999 | Saint-Germain | |
| 5,918,771 A | 7/1999 | van der Heijden | |
| 5,929,530 A | 7/1999 | Stone | |
| 5,949,123 A | 9/1999 | Le et al. | |
| 5,981,902 A | 11/1999 | Arita et al. | |
| 5,990,413 A | 11/1999 | Ortabasi | |
| 6,008,449 A | 12/1999 | Cole | |
| 6,011,307 A | 1/2000 | Jiang et al. | |
| 6,020,554 A | 2/2000 | Kaminar et al. | |
| 6,032,997 A | 3/2000 | Elliott et al. | |
| 6,047,862 A | 4/2000 | Davies | |
| 6,091,017 A | 7/2000 | Stern | |
| 6,118,067 A | 9/2000 | Lashley et al. | |
| 6,130,465 A | 10/2000 | Cole | |
| 6,140,570 A | 10/2000 | Kariya | |
| 6,164,633 A | 12/2000 | Mulligan et al. | |
| 6,203,621 B1 | 3/2001 | Tran et al. | |
| 6,257,450 B1 | 7/2001 | Jackson et al. | |
| 6,274,508 B1 | 8/2001 | Jacobsen et al. | |
| 6,278,054 B1 | 8/2001 | Ho et al. | |
| 6,293,498 B1 | 9/2001 | Stanko et al. | |
| 6,310,281 B1 | 10/2001 | Wendt et al. | |
| 6,351,098 B1 | 2/2002 | Kaneko | |
| 6,354,791 B1 | 3/2002 | Wytman et al. | |
| 6,379,521 B1 | 4/2002 | Nishio | |
| 6,398,370 B1 | 6/2002 | Chiu et al. | |
| 6,407,329 B1 | 6/2002 | Iino et al. | |
| 6,418,986 B1 | 7/2002 | Gabriele | |
| 6,420,266 B1 | 7/2002 | Smith et al. | |
| 6,423,140 B1 | 7/2002 | Liu et al. | |
| 6,479,395 B1 | 11/2002 | Smith et al. | |
| 6,527,964 B1 | 3/2003 | Smith et al. | |
| 6,531,653 B1 | 3/2003 | Glenn et al. | |
| 6,555,739 B2 | 4/2003 | Kawam | |
| 6,568,863 B2 | 5/2003 | Murata | |
| 6,590,235 B2 | 7/2003 | Carey et al. | |
| 6,597,510 B2 | 7/2003 | Bunkenburg et al. | |
| 6,623,579 B1 | 9/2003 | Smith et al. | |
| 6,663,944 B2 | 12/2003 | Park et al. | |
| 6,666,165 B2 | 12/2003 | Shiraishi et al. | |
| 6,667,434 B2 | 12/2003 | Morizane et al. | |
| 6,743,478 B1 | 6/2004 | Kiiha et al. | |
| 6,896,381 B2 | 5/2005 | Benitez et al. | |
| 6,924,493 B1 | 8/2005 | Leung | |
| 6,958,868 B1 * | 10/2005 | Pender | 359/742 |
| 7,045,794 B1 | 5/2006 | Spallas et al. | |
| 7,101,592 B2 | 9/2006 | Gueggi et al. | |
| 7,152,985 B2 | 12/2006 | Benitez et al. | |
| 7,160,522 B2 | 1/2007 | Minano Dominguez et al. | |
| 7,181,378 B2 | 2/2007 | Benitez et al. | |
| 7,388,147 B2 | 6/2008 | Mulligan et al. | |
| 2002/0056473 A1 | 5/2002 | Chandra et al. | |
| 2002/0060208 A1 | 5/2002 | Liu et al. | |
| 2002/0148497 A1 | 10/2002 | Sasaoka et al. | |
| 2002/0149107 A1 | 10/2002 | Chang et al. | |
| 2002/0154396 A1 | 10/2002 | Overbeck | |
| 2003/0095175 A1 | 5/2003 | Agorio | |
| 2003/0201581 A1 | 10/2003 | Weber et al. | |
| 2003/0232174 A1 | 12/2003 | Chang et al. | |
| 2004/0012676 A1 | 1/2004 | Weiner | |
| 2004/0031517 A1 | 2/2004 | Bareis | |
| 2004/0048001 A1 | 3/2004 | Kiguchi et al. | |
| 2004/0070855 A1 | 4/2004 | Benitez et al. | |
| 2004/0084077 A1 | 5/2004 | Aylaian | |
| 2004/0151014 A1 | 8/2004 | Speakman | |
| 2004/0191422 A1 | 9/2004 | Kataoka | |
| 2004/0200520 A1 | 10/2004 | Mulligan et al. | |
| 2004/0211460 A1 | 10/2004 | Simburger et al. | |
| 2005/0029236 A1 | 2/2005 | Gambino et al. | |
| 2005/0034751 A1 | 2/2005 | Gross et al. | |
| 2005/0046977 A1 * | 3/2005 | Shifman | 359/853 |
| 2005/0133084 A1 | 6/2005 | Joge et al. | |
| 2005/0194037 A1 | 9/2005 | Asai | |
| 2005/0221613 A1 | 10/2005 | Ozaki et al. | |
| 2006/0207650 A1 | 9/2006 | Winston et al. | |
| 2006/0231133 A1 | 10/2006 | Fork et al. | |
| 2006/0251796 A1 | 11/2006 | Fellingham | |
| 2008/0047605 A1 | 2/2008 | Benitez et al. | |
| 2008/0138456 A1 | 6/2008 | Fork et al. | |
| 2008/0186593 A1 | 8/2008 | Chan et al. | |

FOREIGN PATENT DOCUMENTS

| | | |
|---|---|---|
| CN | 1854637 A | 11/2006 |
| DE | 197 35 281 A1 | 2/1999 |
| EP | 0 257 157 A | 3/1988 |
| EP | 1 145 797 A | 10/2001 |
| EP | 1715260 A | 10/2006 |
| EP | 1 763 086 A | 3/2007 |
| EP | 1 833 099 A | 9/2007 |
| JP | 02 187291 A | 7/1990 |

| | | |
|---|---|---|
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A | 9/2006 |
| WO | WO 2007/104028 | 9/2007 |

OTHER PUBLICATIONS

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.
Cuevas et al. "50 Per Cent More Output Power from an Albedo-Collecting Flat Panel Using Bifacial Solar Cells", *Solar Energy*, vol. 29, No. 5, pp. 419-420, 1982.
Finlayson et al. "$Bi_2O_3$-$Wo_3$ compounds for photocatalytic applications by solid state and viscous processing", Title from a conference scheduled for Oct. 6-7, 2004 in Munich, 8 pages.
Kränzl et al. "Bifacial Solar Cells on Multi-Crystalline Silicon", 15th International Photovoltaic Science & Engineering Conference, Shanghai, China, 2 pages, 2005.
Mueller et al. "Breathable Polymer Films Produced by the Microlayer Coextrusion Process", Journal of Applied Polymer Science, vol. 78, pp. 816-828, 2000.
Rao et al. "Microfabricated Deposition Nozzles for Direct-Write Assembly of Three-Dimensional Periodic Structures", *Advanced Materials*, vol. 17, No. 3, Feb. 10, 2005, 5 pages.
U.S. Appl. No. 11/282,882, filed Nov. 17, 2005, Fork et al.
Recart et al. "Large Area Thin BSF Solar Cells With Simultaneously Diffused Boron and Phosphorus Screen Printed Emitters", IEEE, pp. 1213-1216, 2005.
Taguchi et al. An Approach for the Higher Efficiency in the HIT Cells, IEEE, pp. 866-871, 2005.
Van Hoy et al. "Microfabrication of Ceramics by Co-extrusion", *J. Am. Ceram. Soc.*, vol. 81, No. 1, pp. 152-158, 1998.
U.S. Appl. No. 11/282,829, filed Nov. 17, 2005, Fork et al.
U.S. Appl. No. 11/336,714, filed Jan. 20, 2006, Fork et al.
Weber et al. "Modelling of Sliver® Modules Incorporating a Lambertian Rear Reflector", The Australian National University, Canberra ACT 0200, Australia, 4 pages, 2005.
Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.
Extrusion/Coextrusion Dies, Extrusion Dies Industries, LLC, http://www.extrusiondies.com/PRODUCTS/ExtrusionDies/multimanifoldDies.html, 1 page.
Hitachi: Offering Total Environmental Solutions, Environmental Activities, http://greenweb.hitachi.co.jp/en/sustainable/total-solution.html, 5 pages, 2003.
Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.
Swanson, Richard M. "The Promise of Concentrators", Received Jun. 16, 1999, Revised Oct. 3, 1999, pp. 93-111.
Bett et al. "FLATCON™ and FFLASHCON™ Concepts For High Concentration PV", Presented at the 19th European Photovoltaic Solar Energy Conf., Jun. 7-11, 2004, Paris, 4 pages.
Alvarez et al. "RXI Concentrator For 1000X Photovoltaic Energy Conversion".
Mulligan et al. "Development Of Chip-Size Silicon Solar Cells".
Nguyen, Luu "Wafer Level Packaging For Analog/Mixed Signal Applications", MEPTEC Int. Wafer Level Packaging Conference, Aug. 22, 2002.
Benitez et al. "High-Concentration Mirror-Based Kohler Integrating System for Tandem Solar Cells", WCPEC2006, 4 pages.
J. Sun et al. "Modeling and Experimental Evaluation of Passive Heat Sinks for Miniature High-Flux Photovoltaic Concentrators", Transactions of the ASME, vol. 127, pp. 138-145 (2005).
Terao et al. "A Mirror-Less Design for Micro-Concentrator Modules", Conference Record of the 28th IEEE Photovoltaic Specialists Conference (2000) pp. 1416-1419.
Kenis et al. "Fabrication inside Microchannels Using Fluid Flow", Accounts of Chemical Research, vol. 33, No. 12, 2000, pp. 841-847.
Kerschaver et al. "Back-contact Solar Cells: A Review," Progress in Photovoltaics: Research and Applications, 2006, vol. 14, pp. 107-123.
Neuhaus et al. "Industrial Silicon Wafer Solar Cells," Advances in OptoElectronics, vol. 2007, 2007, 15 pages.
Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.
SunPower Corp. News Release, May 12, 2008, Available URL: http://investors.sunpowercorp.com/releasedetail.cfm?ReleaseID=309613.
Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.
Nijs et al. "Overview of solar cell technologies and results on high efficiency multicrystalline silicon substrates," Solar Energy Materials and Solar Cells, vol. 48, No. 1-4, Nov. 1, 1997, pp. 199-217.
Sparber et al. "Comparison of texturing methods for monocrystalline silicon solar cells using KOH and $Na_2$ $CO_3$," 3rd World Conf. Photovoltaic Energy Conversion, Osaka, 2003, pp. 1372-1375.
MacDonald et al. "Texturing industrial multicrystalline silicon solar cells," Solar Energy, vol. 76, 2004, pp. 277-283.
Tool et al. "Straightforward in-line processing for 16.8% efficient mc-Si solar cells," 31st IEEE Photovoltaic Specialists Conf., Florida, 2005, pp. 1324-1327.
Fukui et al. "17.7% efficiency large area multicrystalline silicon solar cell using screen-printed metallization technique," 31st IEEE Photovoltaic Specialists Conf., Florida, 2005, pp. 979-982.
Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.
Zhao et al. "19.8% efficient 'honeycomb' textured multicrystalline and 24.4% monocrystalline silicon solar cells," Applied Physics Letters, vol. 73, pp. 1991-1993, 1998.
Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.
Murphy, Jr. "Home photovoltaic systems for physicists," *Physics Today*, Jul. 2008, pp. 42-47.

* cited by examiner

BEAM INTEGRATION FOR CONCENTRATING SOLAR COLLECTOR

FIELD OF THE INVENTION

This invention relates to solar power generators, more particularly to concentrating solar collectors.

BACKGROUND OF THE INVENTION

Photovoltaic (PV) solar energy collection devices used to generate electric power generally include flat-panel collectors and concentrating solar collectors. Flat collectors generally include large-area PV cell arrays and associated electronics formed on semiconductor (e.g., monocrystalline silicon or polycrystalline silicon) substrates, and the electrical energy output from flat collectors is a direct function of the area of the array, thereby requiring large, expensive semiconductor substrates. Concentrating solar collectors reduce the need for large semiconductor substrates by concentrating light beams (i.e., sun rays) using solar concentrator optics (e.g., parabolic reflectors or lenses) that focus the incident light beams, creating a more intense, focused beam of solar energy that is directed onto a relatively small PV cell. Thus, concentrating solar collectors have an advantage over flat-panel collectors in that the PV cells utilize substantially smaller amounts of semiconductor, thereby reducing overall manufacturing costs. Another advantage that concentrating solar collectors have over flat-panel collectors is that they are more efficient at generating electrical energy because they can economically employ higher efficiency PV cells that have a higher cost per unit area due to a more complex structure and different materials.

FIGS. 12 and 13 are exploded perspective view and cross-sectional side views showing a simplified conventional Cassegrain-type concentrating solar collector 50 that includes a PV cell 51 and a solar concentrator optical system 52 including a primary mirror 53 and a secondary mirror 54 that reflect and focus light beams LB through a central opening 53A of primary mirror 53 to form a focused beam 55 (i.e., a region of peak irradiance or power per unit area). As indicated in FIG. 13, primary mirror 53 and secondary mirror 54 are supported on a frame (not shown) such that incident light beams LB are focused to form a high intensity focused beam 55 at a predetermined image plane IP. PV cell 51 is mounted on a structural support or stage 56 that maintains PV cell 51 in the image plane of solar concentrator optical system 52 such that PV cell 51 coincides with focused beam 55.

FIG. 14 is an irradiance (light power per unit area) plot showing the characteristic circular light distribution associated with the image of the sun formed by a focused beam 55 generated by conventional Cassegrain-type concentrating solar collector 50. The angular diameter of the solar disk is approximately 0.54 degrees. Note that the light distribution of focused beam 55 is at the maximum (uppermost) end of the range chart in the central (cross-hatched) region of the irradiance plot, and drops to the minimum (lowermost) end of the range chart abruptly. Note also that, when generated by standardized integrated circuit fabrication techniques, PV cell 51 is square or rectangular, and as such does not match the shape of conventional focused beam 55.

Because PV cell 51 accounts or a significant portion of the overall cost of concentrating solar collector 50, there is a significant incentive to minimize the size (and, hence, the production cost) of PV cell 51. However, the power generated by a particular PV cell is generally related to the total amount of the incident light on the PV cell. As such, in order to reduce the size of PV cell 51 while maintaining the same power output, solar concentrator optical system 52 must be modified in a way that decreases the size of focused beam 55, which also increases its intensity.

For example, as depicted in FIG. 16(A), assume the solar concentrator optics of a conventional concentrating solar collector generate a relatively large, low intensity focused beam 55A that is optimized for a relatively large PV cell 51A. Usually the cell size is designed to be much larger than the size of the focused beam to capture all of the light and accommodate the effects of fabrication tolerances and pointing errors. Because essentially all of focused beam 55A is directed onto PV cell 51A, PV cell 51A generates electrical power that is proportional to the total solar energy transmitted in focused beam 55A. In contrast, if relatively large PV cell 51A is replaced with a relatively small PV cell 51B, PV cell 51B generates electrical power that is proportional to only a portion of the solar energy transmitted in focused beam 55B (i.e., as indicated in FIG. 16(A), a large portion of focused beam 55A misses PV cell 51B and strikes support 56). In order for relatively small PV cell 51B to generate power that is comparable to the PV cell 51A/focused beam 55A combination, the solar concentrator optics would need to be modified to such that the incident light beams are focused onto a smaller area, thereby forming a relatively high intensity focused beam 55B that is substantially the same size or smaller than PV cell 51B.

A problem associated with concentrating solar collectors is that a trade-off is required between the size of the PV cell and the acceptance angle of the solar concentrator optics. The acceptance angle of a concentrating solar collector is the angle of the incident light beams, relative to the optical axis, at which power generation by the PV cell falls below its maximum value.

Referring to FIG. 15(A), when the incident light beams LB are substantially parallel to the central optical axis X of the solar concentrator optics (see FIG. 15(A)), both low intensity focused beam 55A and high intensity focused beam 55B are substantially centered on relatively PV cell 51A (as shown in FIG. 16(A)). Thus, incident light beams LB that are substantially parallel to the central optical axis X are within the acceptance angles of both low and high resolution solar concentrator optics because PV cell 51A collects all of the light from both low intensity focused beam 55A and high intensity focused beam 55B.

As the position of the sun changes from an optimal position illustrated in FIG. 15(A) to a non-optimal position, the direction of the incident light assumes an incidence angle $\theta_1$ relative to the optical axis X (as shown in FIG. 15(B)). As indicated in FIG. 16(B), due to the optics required to form high intensity focused beam 55B, incidence angle $\theta_1$ causes focused beam 51B to move at least partially off of PV cell 51B, thereby causing the power generated by PV cell 51B to drop below the maximum value. Thus, incidence angle $\theta_1$ is greater than the acceptance angle of the solar concentrator optics needed to generate high intensity focused beam 55B. Similarly, as also shown in FIG. 16(B), when the solar concentrating optics are arranged to generate low intensity focused beam 55A, the amount of movement of focused beam 55A in response to incidence angle $\theta_1$ is more pronounced, and because the irradiance area of the image is larger, PV cell 51A collects less of focused beam 55A, and therefore does not maintain the maximum power output. Thus, incidence angle $\theta_1$ is not within acceptance angle of the solar concentrator optics needed to generate low intensity focused beam 55B.

The basic example illustrates that solar concentrator optics must maintain a small spot size and have a reasonable acceptance angle to insure that all of the light underfills or critically fills the PV cell for maximum power output. The acceptance angle is typically much less than the angle traversed by the sun. This is addressed by incorporating a positioning system that adjusts (e.g., tilts) the concentrating solar collector to "follow" the sun throughout the course of a day to keep the sun within the acceptance angle. If the acceptance angle is very small, the increased tracking accuracy needed greatly increases the overall cost of producing and maintaining a concentrating solar collector array. Conversely, when solar concentrator optics are designed to increase the acceptance angle without having to increase the PV cell size, the associated costs can be lowered. If not, either the power generation is reduced, or a larger (and more expensive) PV cell is needed.

Another problem associated with the use of solar concentrator optics that are adjusted to increase the concentration of light (i.e., to produce high intensity focused beam 55B) is the high light concentration also results in high peak intensities of stray off-axis light as the light distribution no longer falls on PV cell 51B, and begins to fall on support 56. As indicted in FIGS. 15(C) and 16(C), when the light beams LB are directed at a relatively large incidence angle $\theta_2$ relative to the optical axis X, focused light beam 55B is located entirely off of (next to) PV cell 55, whereby the high intensity solar energy is transferred to support 56. To address such stray light issues that may arise as a result of high intensity focused beam 55B striking support 56, support 56 must be provided with baffling, thermal management structures, or extensive heat sinking to avoid potentially catastrophic failure modes.

Referring again to FIGS. 12 and 13, another problem with conventional concentrating solar collectors, such as solar collector 50, is that they are expensive to produce, operate and maintain. The solar collector optics (e.g., primary mirror 53 and secondary mirror 54) used in conventional collectors to focus the light beams are produced separately, and must be painstakingly assembled to provide the proper alignment between focused beam 55 and PV cell 51 (i.e., such that focused beam 55 is centered on PV cell 51). Further, over time, the reflectors and/or lenses can become misaligned due to thermal cycling or vibration, causing focused beam to become misaligned (e.g., as depicted in FIGS. 16(B) and 16(C)), and become dirty due to exposure to the environment, thus reducing the intensity of focused beam 55. Maintenance in the form of cleaning and adjusting the reflectors/lenses can be significant, particularly when the reflectors/lenses are produced with uneven shapes that are difficult to clean.

What is needed is a concentrator-type solar collector that maintains or increases the acceptance angle without having to increase the size of the PV cell. What is also needed is a concentrator-type solar collector that provides the increased acceptance angle while avoiding the expensive assembly and maintenance costs associated with conventional concentrator-type solar collectors.

SUMMARY OF THE INVENTION

The present invention is directed to a concentrating solar collector that utilizes a solar collector optical system to concentrate solar light onto a PV cell (image plane), wherein the solar collector optical system comprises an array of first optical elements that divide the solar light into separate beams, and a secondary optical system that integrates (superimposes) the separate beams in a defocused state at the image plane, thereby forming a uniform light distribution pattern on the PV cell. By dividing and then integrating the separate beams, the solar collector optical system shapes the light distribution at the image plane in a way that decreases the peak concentration level without having to increase the PV cell size.

In accordance with an embodiment of the invention, the plurality of first optical elements comprises an array of lenslets disposed in an aperture plane, the secondary optical system includes a single secondary optical element having a central optical axis that intersects the aperture plane. The lenslets have parallel optical axes that are parallel to the central optical axis, and the lenslets have substantially identical focal length. Each lenslet focuses an associated separate beam such that the rays of the separate beam converge and then diverge before reaching the secondary optical element, and the secondary optical element focuses and redirects the diverging separate beams onto the PV cell such that the separate beams from all of the lenslets are superimposed on the PV cell.

In accordance with an embodiment of the present invention, the secondary optical system includes a Cassegrain-type optical system including a concave primary mirror and a convex secondary mirror that define a central optical axis and a primary focal point located at a predetermined first location on the image plane (e.g., at a central region of the PV cell). The lenslets (first optical elements) are integrated with the Cassegrain-type optical system in the sense that at least a portion of the light directed toward the primary mirror is intercepted by the lenslets. In one embodiment, a first portion of the light that strikes the primary mirror is focused by the primary optical system onto the first region of the image plane in a manner similar to that generated in a conventional Cassegrain-type solar collector. However, unlike conventional Cassegrain-type solar collectors, a second portion of the light is intercepted by the lenslets, which form separate beams as described above. The separate beams are directed along secondary optical axes that are parallel to but spaced from the central optical axis, and are superimposed on the PV cell (i.e., around the primary focal point). By intercepting portions of the light directed onto the primary mirror, the lenslets spread the amount of light focused by the primary optical system, thereby reducing the peak irradiance of the focused beam generated by the Cassegrain-type optical system at the primary focal point.

In accordance with an embodiment of the present invention, each of first optical elements includes a curved (e.g., spherical) aperture/reflective surface having an optical axis that is perpendicular to the reflective surface, and the curved surface is truncated by four straight peripheral edges. In one specific embodiment, the first optical elements are lenslets, and the four peripheral edges produce a square lenslet aperture. These square-shaped lenslets produce a square-shaped light distribution pattern that matches the peripheral shape of the PV detector, thereby filling more of the PV detector and thus reducing the maximum irradiance on the PV detector.

In accordance with an embodiment of the present invention, a concentrating solar collector includes an aperture surface defining an array of square aperture lenslets, where the straight peripheral edges of each lenslet are shared with at least one adjacent lenslet, and the lenslet array extends over the entire aperture surface. In one embodiment, the square-shaped lenslets are arranged and positioned such that the square-shaped light distributions are superimposed over an area of the image plane that coincides with the square shape of the PV cell, thereby reducing the maximum irradiance by exposing more of PV cell surface to focused light having a substantially constant intensity.

In accordance with an embodiment of the present invention, a concentrating solar collector includes a solid glass or plastic optical structure having a relatively large convex (protruding) lower surface, and an upper aperture surface having a relatively small centrally-located concave (curved) surface (e.g., a depression). Cassegrain type primary and secondary mirrors are respectively disposed on the convex lower surface and in the central depression such that the reflective surfaces face into the optical structure. In one embodiment, the convex and concave surfaces are associated conic (e.g., hyperbolic and/or parabolic) surfaces arranged such that the portion of light passing through the aperture surface onto any point on the primary mirror is reflected to a corresponding point on the secondary mirror, which in turn re-reflects the light through a lower aperture surface, which is located in an opening defined at the apex of the primary mirror, and onto a central region of the PV cell. Because the optical structure is solid (i.e., because the convex and concave surfaces remain fixed relative to each other), the primary and secondary mirrors remain permanently aligned, thus maintaining optimal optical operation while minimizing maintenance costs. Moreover, the loss of light at gas/solid interfaces is minimized because only solid optical material (e.g., low-iron glass) is positioned between the primary and secondary mirrors. In one embodiment, the primary and secondary mirrors are films that are directly formed (e.g., deposited or plated) onto the convex and concave surfaces, respectively, of the optical structure. By carefully molding the optical structure to include convex and concave surfaces having the desired shape and position, the primary and secondary mirrors are essentially self-forming and self-aligned when formed as mirror material films, thus greatly simplifying the manufacturing process and minimizing production costs. Forming the primary and secondary mirrors directly on the optical element also facilitates simultaneous low-cost plating of both mirrors using the same mirror material (e.g., silver), thus further reducing manufacturing costs.

In one embodiment, the concentrating solar collector includes an array of lenslets disposed on the upper aperture surface and arranged around the central depression in a predetermined (e.g., square) pattern. Each of the lenslets is mounted on or integrally molded with the upper aperture surface, and has a predetermined surface shape (e.g., spherical, conic, aspherical, cylindrical, toroidal, on-axis or off-axis sectioning, concave, or convex) and a predetermined axial position, diameter, and tilt that are selected to produce a desired (e.g., square-shaped) light distribution pattern on the PV cell. In a specific embodiment, the lenslets have the square aperture shape described above.

In accordance with another embodiment of the present invention, a concentrating solar collector includes an array of third optical elements that cooperate with the lenslets (first optical elements) to generate the desired light distribution pattern in a manner that greatly increases the acceptance angle. Each third optical element is aligned with an associated lenslet, whereby the focused image of each lenslet is reflected or otherwise redirected to the PV cell despite small changes to the incident angle of the solar light. In one embodiment the third optical elements are mirrors defined by protruding sections of a solid optical structure (discussed above) and are automatically formed and aligned by mirror material coated onto the solid optical structure. With this arrangement, off-axis sunlight that enters the concentrating solar collector through the lenslet array is corrected by the third optical elements, thereby greatly increasing the acceptance angle without increasing the PV cell size.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in concentrating solar collectors. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrase "integrally molded" is used herein to describe the connective relationship between two portions of a single molded or machined structure, as distinguished from two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
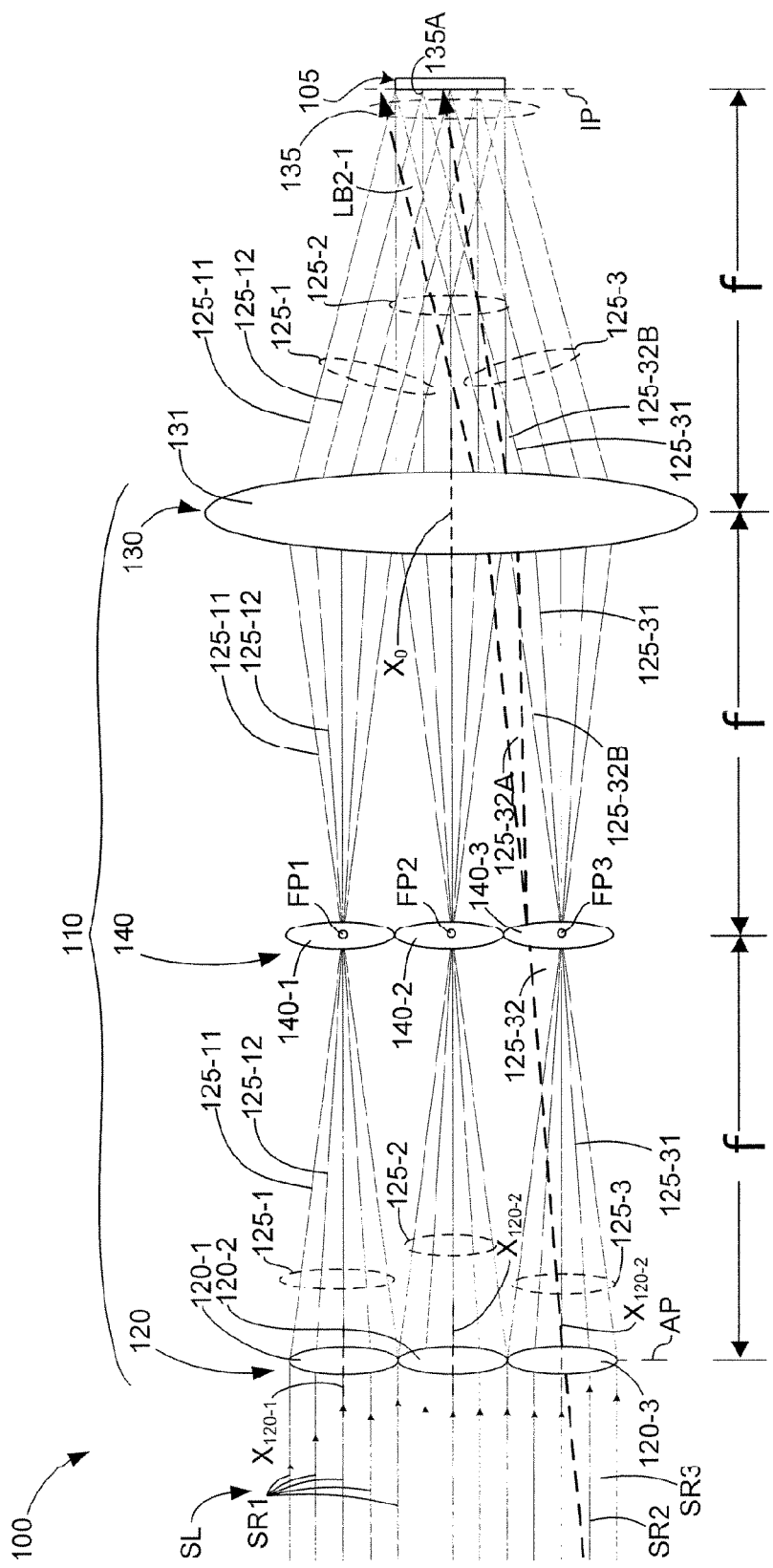
FIG. 1 is a laid-out view showing a simplified concentrating solar collector according to a generalized embodiment of the present invention.

FIG. 1 is a laid-out view showing a concentrating solar collector 100 according to a simplified embodiment of the present invention. Concentrating solar collector 100 generally includes a PV cell 105 that is supported in (defines) an image plane IP, and a solar collector optic system 110 for concentrating solar light SL onto PV cell 150. Solar collector optical system 110 includes a first array 120 including several first optical elements 120-1 to 120-3 that are arranged in an aperture plane AP, a secondary optical system 130 including at least one secondary optical element 131, and an optional third optical system 140 including several third optical elements 140-1 to 140-3 disposed between first optical elements 120-1 to 120-3 and secondary optical system 130. Although first optical elements 120-1 to 120-3, secondary optical system 130 and third optical elements 140-1 to 140-3 are depicted as lens-type optical elements, one or more of first optical elements 120-1 to 120-3, secondary optical system 130 and third optical elements 140-1 to 140-3 may be replaced, for example, with parabolic mirrors.

As indicated in FIG. 1, first optical elements (lenslets) 120-1 to 120-3 serve to divide (separate) incoming solar light SL, into separate beams 125-1 to 125-3, respectively, and to direct separate beams 125-1 to 125-3 onto secondary optical element 131 in a diverging state. In effect, lenslets 120-1 to 120-3 convert incoming parallel solar light SL into multiple (in this example, three) point sources that direct their associated diverging light rays to secondary optical element 131. For example, lenslet 120-1 receives solar rays SR1 (which represent a portion of solar light SL that is directed onto lenslet 120-1), and focuses solar rays SR1 to form separate beam 125-1 including rays 125-11 and 125-12 that initially converge to a focused state at focal point FP1, and then diverge as they approach secondary optical element 131. Similarly, lenslet 120-2 focuses an associated second portion of solar light beams LB to form separate beam 125-2 that pass through a focal point FP2, and lenslet 120-3 focuses an associated third portion of solar light beams LB to form separate beam 125-3 through a focal point FP3.

Secondary optical element 131 re-converges the diverging separate beams 125-1 to 125-3 and directs the re-converged separate beams such the plurality of separate beams 125-1 to 125-3 are directed in a defocused state onto PV cell 105. In the disclosed embodiment, secondary optical element 131 defines a central optical axis $X_0$ that intersects aperture plane AP, and lenslets 120-1 to 120-3 have parallel optical axes $X_{120-1}$ to $X_{120-2}$ that are parallel to central optical axis $X_0$, and lenslets 120-1 to 120-3 have a substantially identical focal length f. Secondary optical element 131 is positioned at a distance equal to 2f (two time the focal length f) from aperture plane AP, whereby the rays of each separate beam 125-1 to 125-3 leaving secondary optical element 131 are parallel. Those skilled in the art will recognize that positioning secondary optical element 131 at a distance less than 2f (e.g., closer to focal point FP1) or at a distance further than 2f will produce divergent or convergent rays, respectively. Of these possible arrangements, the parallel arrangement depicted or an arrangement producing convergent or divergent rays may be used.

In accordance with an aspect of the present invention, PV cell 105 is positioned such that all of the separate beams leaving secondary optical element 131 are superimposed (i.e., directed onto the same area) in a defocused state, thereby producing uniform light distribution 135 on PV cell 105. In the disclosed embodiment (i.e., with secondary optical element 131 positioned the distance 2f from aperture plane AP), the image plane (IP) defined by PV cell 105 is positioned at a distance equal to one focal length f from secondary optical element 131, thereby causing the parallel separate beams leaving secondary optical element 131 to converge onto the same area, which in this case coincides with the surface of PV cell 105.

As set forth in the above example, by dividing solar light SL into separate beams 125-1 to 125-3, and then integrating separate beams 125-1 to 125-3 in the defocused state, solar collector optical system 100 produces a uniform light distribution 135 in a way that decreases the peak concentration level without having to increase the size of PV cell 105. Further, as described below with reference to the disclosed specific embodiments, by selectively shaping the peripheral edges of first optical elements 120-1 to 120-3, the shape of uniform light distribution 135 (i.e., shape of the area onto which separate beams 125-1 to 125-3 are superimposed) can also be made to match the shape of PV cell 105.

In accordance with another aspect of the present invention, optical system 110 further includes a third array 140 including third optical elements 140-1 to 140-3 that cooperate with lenslets (first optical elements) 120-1 to 120-3 to generate light distribution pattern 135 in a manner that greatly increases the acceptance angle of solar collector apparatus 100. Each third optical element 140-1 to 140-3 is positioned at the focal point of an associated first optical element 120-1 to 120-3. For example, third optical element 140-1 is shown as being located at focal point FP1 defined by first optical element 120-1. Third optical elements 140-1 to 140-3 are also disposed one focal length f from secondary optical element 131. By positioning third optical elements 140-1 to 140-3 in this manner, third optical elements 140-1 to 140-3 serve to reflect or otherwise redirect the focused image at the focal points (e.g., focal point FP1) in a manner that greatly increases the acceptance angle. By way of example, solar ray SR2 is directed parallel to optical axis $X_0$, and is focused by lenslet 120-3 as ray 125-31 of separate beam 125-3 through focal point FP3 and onto a point 135A of light distribution pattern 135 in the manner described above. In contrast, solar beam SR3 is directed at an acute angle to $X_0$, and is focused by lenslet 120-3 as ray 125-32 along a path indicated by the dashed line that passes above focal point FP3. In the absence of third optical element 140-3, ray 125-32 continues on path 125-32A through secondary optical element 131, and entirely misses PV cell 105 at image plane IP. Thus, without third optical elements 140-1 to 140-3, the acceptance angle of optical system 110 is relatively small. Conversely, when third optical element 140-3 is present, ray 125-32 is redirected by third optical element 140-3 along corrective path 125-32B, which is then directed by secondary optical element 131 to a point very close to point 135A of light distribution pattern 135. Thus, by incorporating third optical elements 140-1 to 140-3 into optical system 11, the acceptance angle of solar collector apparatus 100 is greatly increased.

Referring to the right side of FIG. 1, similar to conventional Cassegrain-type solar collectors, primary optical system 130 includes a concave primary mirror 132 and a convex secondary mirror 134 In particular, as indicated by the dashed-line arrow in FIG. 1, primary mirror 132 and secondary mirror 134 are shaped and arranged such that a light beam LB having any light path that is parallel to central optical axis $X_0$ and intersects primary mirror 132 is reflected toward secondary mirror 134, and is re-reflected by secondary mirror 134 onto point 107, which in the disclosed embodiment coincides with a central region of PV cell 105.

Figure 2:
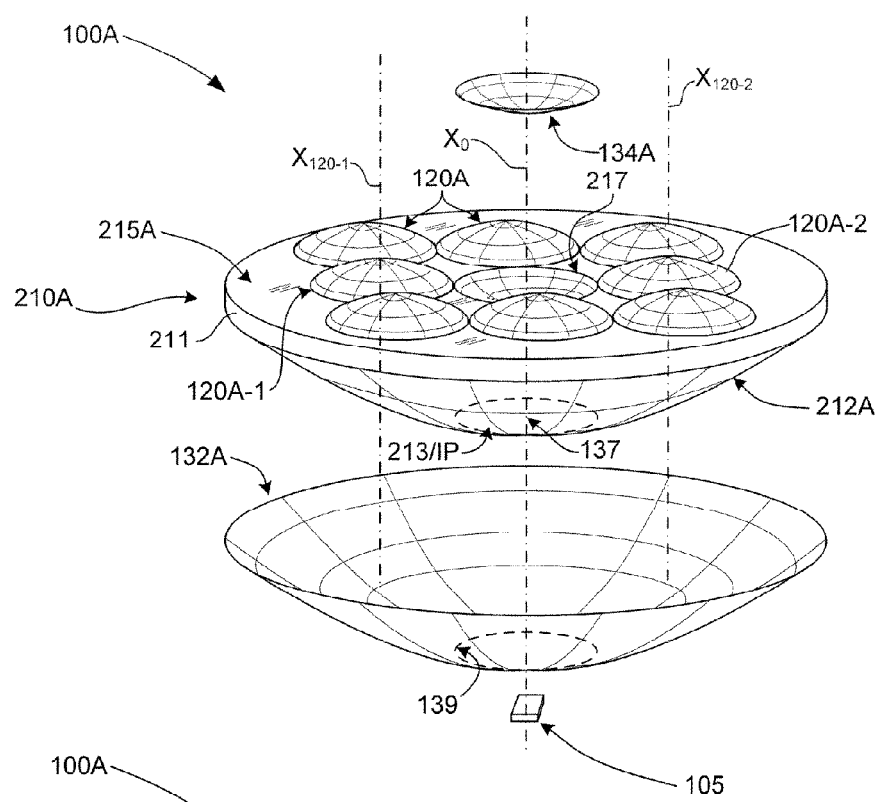
FIG. 2 is an exploded perspective view showing a Cassegrain-type concentrating solar collector according to an embodiment of the present invention.
Figure 3:
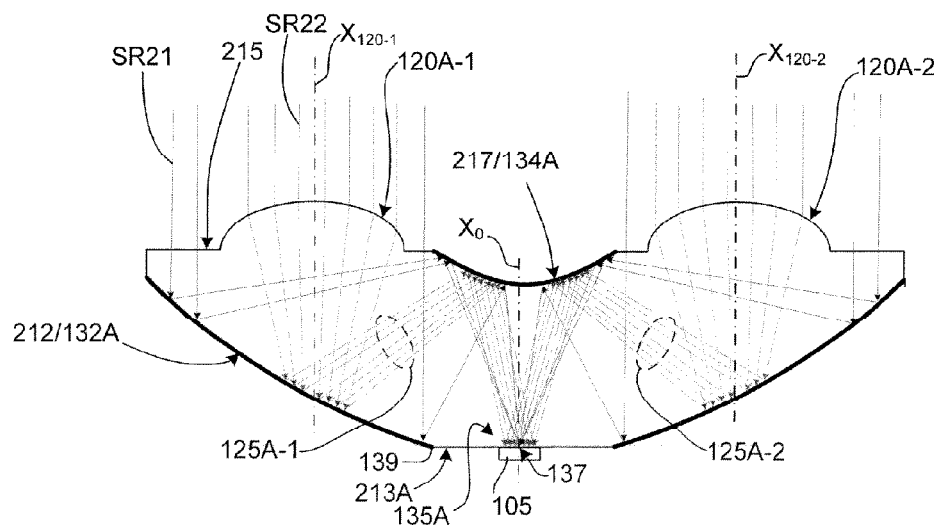
FIG. 3 is a cross-sectional side view showing the concentrating solar collector of FIG. 2 during operation.

FIGS. 2 and 3 are exploded perspective and cross-sectional side views, respectively, showing an internal mirror, Cassegrain-type concentrating solar collector 100A according to a simplified specific embodiment of the present invention. Similar to conventional Cassegrain-type concentrating solar collectors, concentrating solar collector 100A generally includes a primary mirror 132A and a secondary mirror 134A that cooperatively serve the function of optical element 131 of solar collector 100 (described above). Primary mirror 132A and a secondary mirror 134A define a central optical axis $X_0$ and a primary focal point 137 located on image plane IP (also referred to herein as a PV detector plane), which coincides with a surface of PV cell 105 (when mounted as shown in FIG. 3). Concentrating solar collector 100A differs from conventional arrangements in that it also includes a solid optical structure 210 and a lenslet array 120A made up of eight lenslets including lenslets 120A-1 and 120A-2.

Optical structure 210 is a solid, disk-like, light-transparent structure including an upper layer 211, a relatively large convex surface 212 protruding from a lower side of upper layer 211, a substantially flat (first) aperture surface 215 disposed on an upper side of upper layer 211, and a relatively small concave (curved) surface (depression) 217 defined in aperture surface 215 (i.e., extending into upper layer 211). In order to minimize material, weight, thickness and optical adsorption, upper layer 211 may be vanishingly small. The concavity of secondary mirror 134A may extend beyond the thickness of upper layer 211. Photovoltaic cell 105 is mounted on a substantially flat (second) aperture surface 213, which is located in the center of and surrounded by convex surface 212.

In one specific embodiment, optical structure 210 is molded using a high quality glass (e.g., BK7 optical glass produced, for example, by Schott) structure according to known glass molding methods. Molded glass provides several advantages over other production methods and materials, such as superior transmittance and surface characteristics (molded glass can achieve near perfect shapes due to its high viscosity, which prevents the glass from filling imperfections in the mold surface). Although molded glass is currently preferred for fabricating optical structure 210 due to its superior optical characteristics, some of the advantages described herein may be achieved by optical elements formed using other light-transmitting materials and/or fabrication techniques. For example, clear plastic may be machined and polished to form single-piece optical structure 210, or separate pieces by be glued or otherwise secured to form optical structure 210.

In accordance with an embodiment of the present invention, primary mirror 132A and secondary mirror 134A are fabricated, for example, by sputtering or otherwise depositing a reflective mirror material (e.g., silver (Ag) or aluminum (Al)) directly onto convex surface 212 and concave surface 217 of optical structure 210, thereby minimizing manufacturing costs and providing superior optical characteristics. By sputtering or otherwise forming a mirror film on convex surface 212 and concave surface 217 using a known mirror fabrication technique, primary mirror 132A substantially takes the shape of convex surface 212, and secondary mirror 134A substantially takes the shape of concave surface 217. As such, optical structure 210 is molded or otherwise fabricated such that convex surface 212 and concave surface 217 are arranged and shaped to produce the desired mirror shapes. Note that, by forming convex surface 212 and concave surface 217 with the desired mirror shape and position, primary mirror 132A and secondary mirror 134A are effectively self-forming and self-aligning, thus eliminating expensive assembly and alignment costs associated with conventional concentrating solar collectors. Further, because primary mirror 132A and secondary mirror 134A remain affixed to optical structure 210, their relative position is permanently set, thereby eliminating the need for adjustment or realignment that may be needed in conventional multiple-part arrangements. In one embodiment, primary mirror 132A and secondary mirror 134A are formed simultaneously using the same (identical) material or materials (e.g., plated Ag), thereby minimizing fabrication costs. Further, by utilizing the surfaces of optical structure 210 to fabricate the mirrors, once light enters into optical structure 210 through aperture surface 215 and/or lenslet array 120A (discussed below), the light is only reflected by primary mirror 132A/convex surface 212 and secondary mirror 134A/concave surface 217 before reaching photovoltaic cell 105. As such, the light is subjected to only one air/glass interface (i.e., aperture surface 215), thereby minimizing losses that are otherwise experienced by conventional multi-part concentrating solar collectors. The single air/glass interface loss can be further lowered using an anti-reflection coating on aperture surface 215. Although it is also possible to separately form primary mirror 132A and secondary mirror 134A and then attach the mirrors to convex surface 212 and concave surface 217, respectively, this production method would greatly increase manufacturing costs and may reduce the superior optical characteristics provided by forming mirror films directly onto convex surface 212 and concave surface 217.

Additional details regarding optical structure 210, primary mirror 132A, secondary mirror 132B, and electrical connections to PV cell 105 are provided in co-owned and co-pending U.S. patent application Ser. No. 11/110,611 entitled "CONCENTRATING SOLAR COLLECTOR WITH SOLID OPTICAL ELEMENT", which is incorporated herein by reference in its entirety.

Lenslet array 120A includes several (in this case eight) separate lenslets (small lenses) that are disposed on (i.e., mounted on or integrally molded with) and protrude above aperture surface 215A, and are arranged around depression 217. Each lenslet of array 160A has a predetermined surface shape (e.g., spherical, conic, aspherical, cylindrical, toroidal, on-axis or off-axis sectioning, concave, or convex) and a predetermined axial position, diameter, and tilt that are selected to produce a desired light distribution pattern. In the present embodiment, each lenslet defines an associated optical axis that is parallel to but spaced from central optical axis $X_0$ (e.g., lenslet 120A-1 defines optical axis $X_{120-1}$, and lenslet 120A-2 defines optical axis $X_{120}$). Accordingly, as indicated in FIG. 3, lens array 120A serves to reduce the concentration at focal point 137 by dividing a portion of the incoming solar light into separate beams that are superimposed in a defocused state to form a distribution pattern 135A around focal point 137 in the manner described above. That is, a first portion of the solar light directed toward collector 100A (e.g., solar ray SR21) passes through flat front aperture surface 215 and is reflected by primary mirror 132A and secondary mirror 134A onto focal point 137 in the manner used in conventional Cassegrain-type solar collectors. However, second portions of the solar light directed toward collector 100A (e.g., solar rays SR22) are divided by one lenslet of the lenslets array 120A (e.g., lenslet 120A-1) and applied in a defocused state on distribution pattern 135A.

FIG. 3 is a side view depicting concentrating solar collector 100A during operation. Similar to conventional concentrating solar collectors, a collector positioning system (not shown; for example, the tracking system used in the MegaModule™ system produced by Amonix, Incorporated of Torrance, Calif., USA) is utilized to position concentrating solar collector 100 such that the incident solar light (e.g., solar rays SR21 and SR22) are directed into aperture surface 215 in a desired direction (e.g., parallel to central optical axis $X_0$ and perpendicular to aperture surface 215). PV cell 105 is disposed in the image plane at which the rays are concentrated by primary mirror 132A, secondary mirror 134A, and lenslet array 120A (e.g., lenslets 120A-1 and 120A-2). In the disclosed embodiment, the concentrating region (image plane) at which PV cell 105 is located coincides with a central region 213, which has been planarized (flattened) to facilitate the mounting of photovoltaic cell 105 and associated wiring using conventional pick-and-place and/or lithographic processing. Note that central region 213 is located directly below and thus defined by the "shadow" of secondary mirror 134A. Note also that central opening 139 is defined in primary mirror 132A to facilitate the passage of light through central region 213 to photovoltaic cell 105. To facilitate the positioning of the concentrating region, convex surface 212, primary mirror 132A, concave surface 217, and secondary mirror 134A are centered on and substantially symmetrical about central optical axis $X_0$, which extends substantially perpendicular to aperture surface 215 (i.e., the curved portions of convex surface 212 and concave surface 217 are defined by an arc rotated around central optical axis $X_0$). Note also that the focus depth (i.e., the distance between secondary mirror 134A and photovoltaic cell 105) may be adjusted depending on the selected optics.

Figure 4:
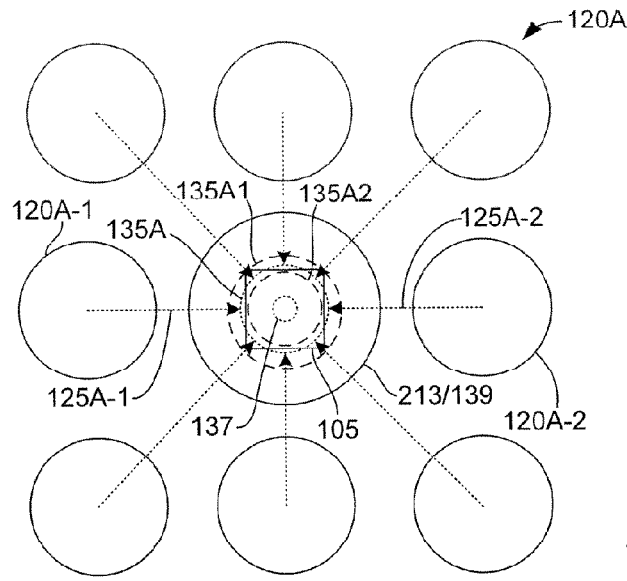
FIG. 4 is top plan view showing a superimposed distribution pattern generated by the optical elements of the concentrating solar collector of FIG. 2 according to an aspect of the present invention.

FIG. 4 is a top plan view depicting lenslet array 120A and central region 213/139, which includes PV cell 105. As depicted in FIG. 4, the separate beams (indicated by arrows) that are divided by each lenslet of array 120A are superimposed to form distribution pattern 135A on PV cell 105. For example, separate beams 125A-1 and 125A-2, which are divided by lenslets 120A-1 and 120A-2, respectively, are superimposed on distribution pattern 135A. Because each separate beam is defocused, the light intensity in distribution pattern 135A attributed to lenslet array 120A is substantially uniform. In contrast, rays (e.g., ray SR21) that pass through flat aperture surface 215A and are reflected in a conventional manner by primary mirror 132A and secondary mirror 134A, are focused onto primary focal point 137, thereby generating a region of relatively high temperature (i.e., hot spot). In order to avoid such hot spots, the amount of the aperture surface occupied by lenslet array 120A is maximized. In some configurations, the rays that pass through the flat aperture surface may not be focused onto the PV cell and will be lost or the flat surface may be difficult to form. In these systems it is necessary to have as close to 100% lenslet fill factors as possible to avoid the loss of light.

In addition to the need to maximize surface coverage by lenslets, it is also a possible to match the shape of the light distribution pattern to the peripheral shape of the PV cell. As indicated in FIG. 4, because the peripheral shape of each of the lenslets of array 120A (e.g., lenslet 120A-1) is round, the separate beams generated by each lenslet of array 120A is round, thus producing a round distribution pattern 135A that fails to match the square-shaped PV cell 105.

Figure 5:
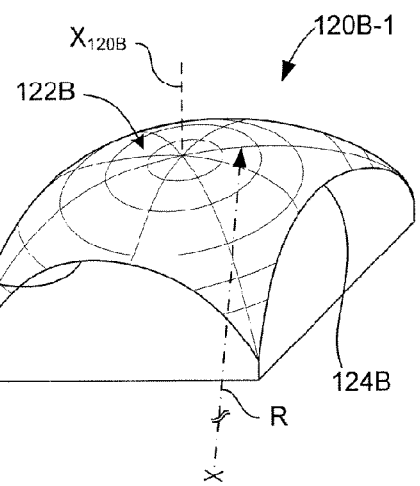
FIG. 5 is perspective view showing a lenslet including a square lenslet aperture according to an embodiment of the present invention.
Figure 6:
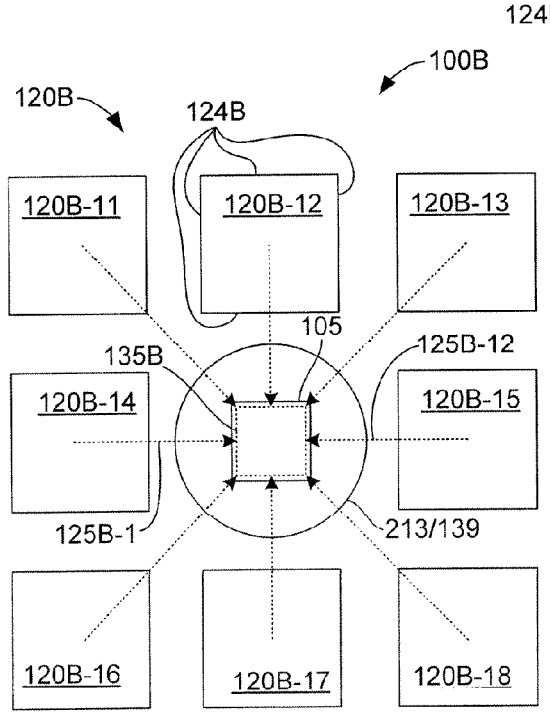
FIG. 6 is a top plan view depicting an array of lenslets with square apertures forming a square light distribution pattern on a PV cell according to an aspect of the present invention.

FIG. 5 is a perspective view showing a lenslet (first optical element) 120B-1 that addresses the issue of matching the light distribution to the PV cell, and FIG. 6 us a top view showing a portion of a simplified solar concentrator 100B including a lenslet array 120B made up of eight lenslets 120B-11 to 120B-18. Referring to FIG. 5, lenslet 120B-1 includes a curved (e.g., spherical) upper aperture surface 122B having an optical axis that is perpendicular to the reflective surface, and the curved surface is truncated by four straight peripheral edges 124B that produce a square lenslet aperture. FIG. 6 shows square-shaped lenslet array 120B in place of round lenslet array 120A (described above), and indicates that each lenslet 120B-11 to 120-B12 produces a square-shaped separate beam (e.g., beams 125B-1 and 125B-2). As in the examples above, these square-shaped beams are superimposed to form a square-shaped light distribution pattern 135B that matches the peripheral shape of PV detector 105. In addition the square or rectangular aperture shape enables a 100% lenslet fill factor thereby providing efficient light collection and power generation. Hexagonal, wedged or keystone aperture shapes can be used as well to provide 100% fill factors. The irradiance distribution shape at the PV cell will be similar to the particular aperture shape.

Figure 7:
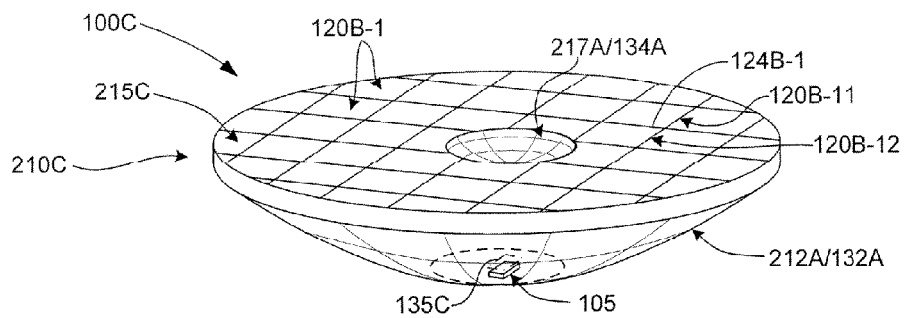
FIG. 7 is a perspective view showing a Cassegrain-type concentrating solar Collector according to another embodiment of the present invention.

FIG. 7 is a perspective view showing a concentrating solar collector 100C according to another specific embodiment of the present invention. Concentrating solar collector 100C includes an optical structure 210C that is similar to optical structure 210B (described above), but differs in that concentrating solar collector 100C includes a 7×7 array of square-shaped lenslets 120B-1 (discussed above) disposed over the entirety of upper aperture surface 215C, and where the straight peripheral edges 124B of each lenslet 120B-1 are shared with at least one adjacent lenslet. For example, straight peripheral edge 124B-1 is shared by adjacent lenslets 120B-11 and 120B-12. Because the entirety of aperture surface 215C is made up of square-shaped lenslets 120B-1, substantially all of the light directed onto PV cell 105 is defocused and uniformly distributed in a light distribution pattern 135C, thereby avoiding the hot spot issue discussed above. Further, because all lenslets 120B-1 of lenslet array 120B have square-shaped apertures, the light distribution pattern 135C matches the shape of PV cell 105.

In one specific embodiment, concentrating solar collector 100C includes lenslets having convex spherical surface shape with a 100 mm radius of curvature. The lenslet array is integrally molded with optical structure 210C, which comprises BK7 glass. Other specific features and dimensions are disclosed in Table 1, which is provided below:

TABLE 1

| Surf | Type | Radius | Thickness | Glass | Diameter | Conic |
| --- | --- | --- | --- | --- | --- | --- |
| Lens Array | Array | 100 | 7.5 | BK7 | 28.00019 | 0 |
| Primary Mirror | Conic | −15 | −6.182465 | MIRROR | 28.00659 | −1.046192 |
| Secondary Mirror | Conic | −3.346731 | 6.182465 | MIRROR | 6.8 | −2.915001 |
| PV Detector Plane | Plano | | Infinity | | | |

Figure 8A:
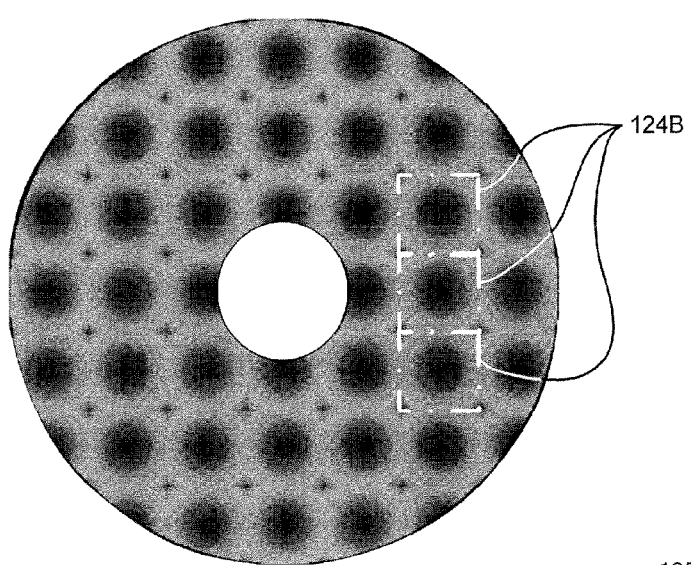
FIGS. 8(A) and 8(B) are photographs showing images of a topographical surface map of the array and the square irradiance light distribution generated by the concentrating solar collector of FIG. 7.
Figure 8B:
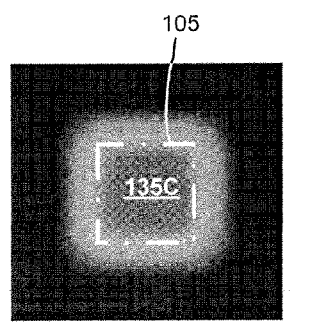

FIG. 8(A) is a topographical surface map indicating the optical surface characteristics of the 7×7 lenslet array formed in accordance with the details provided in Table 1. Straight side edges 124B are superimposed on the photograph for reference. FIG. 8(B) is a photograph showing the light distribution at the PV detector plane produced by the concentrating solar collector produced in accordance with the details provided in Table 1. As indicated by the superimposed dashed lined box, square-shaped light distribution pattern 135C coincides with the square shape of PV cell 105.

FIGS. 9(A), 9(B), 10(A), 10(B), 11(A) and 11(B) are simplified cross-sectional side views showing concentrating solar collectors according to alternative embodiments of the present invention.

Figure 9A:
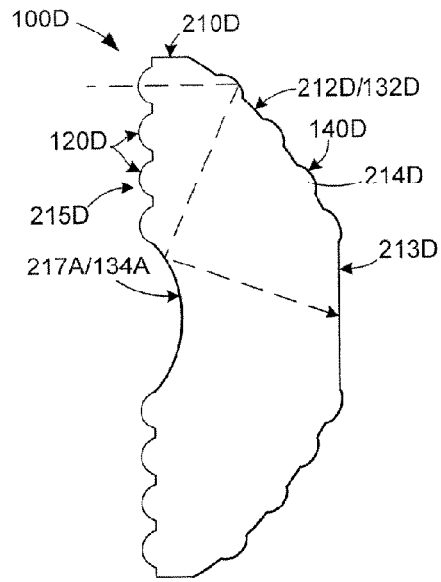
FIGS. 9(A), 9(B), 10(A), 10(B), 11(A) and 11(B) are simplified cross-sectional side views showing concentrating solar collectors including multiple optical element arrays according to alternative embodiments of the present invention.

FIG. 9(A) shows a concentrating solar collector 100D including an optical structure 210D that is similar to optical structure 210B (described above), and includes an array of lenslets 120D having any of the shapes described above. In addition, concentrating solar collector 100D includes an array of curved mirrors (third optical elements) 140D that cooperate with lenslets 120D to generate the desired light distribution pattern in a manner that greatly increases the acceptance angle in the manner described above with reference to third optical elements of FIG. 1. In particular, each mirror 140D is aligned with an associated lenslet 120D, and is positioned such that the separate beam generated by each lenslet 120D is reflected by an associated mirror 140D. In one embodiment, mirrors 140D are formed by mirror material disposed on protrusions 214D integrally molded on convex surface 212D, where the mirror material is deposited simultaneously with mirror 212D in the manner described above.

Figure 9B:
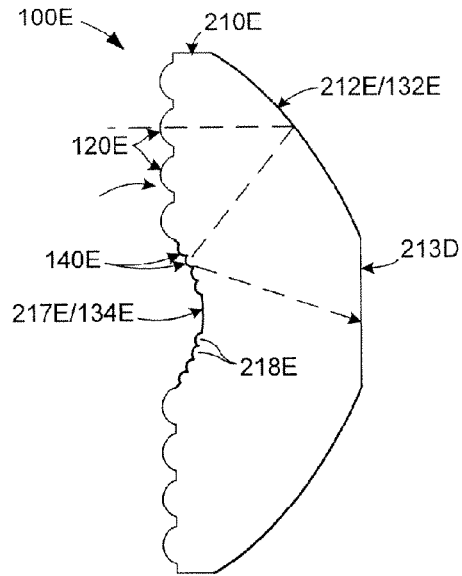

FIG. 9(B) shows a concentrating solar collector 100E including another optical structure 210E that includes an array of lenslets 120E and an array of curved mirrors (third optical elements) 140E that cooperate with lenslets 120E in a manner similar to that of mirrors 140E (described above), except that mirrors 140E are disposed in indentations 218E that are integrally molded into curved surface 217E. Each mirror 140E is aligned with an associated lenslet 120E, and is positioned such that the separate beam generated by each lenslet 120E is reflected by an associated mirror 140E.

Figure 10A:
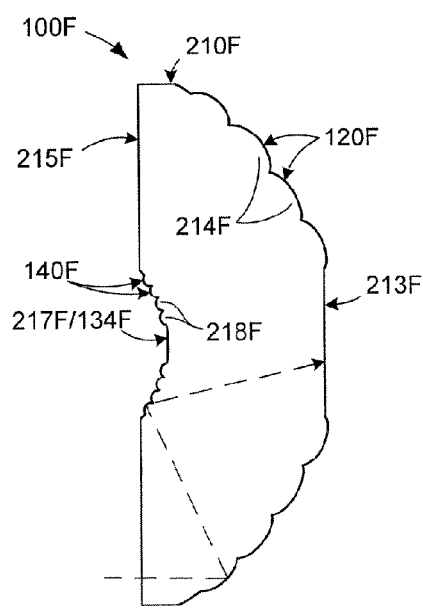

FIG. 10(A) shows a concentrating solar collector 100F including another optical structure 210F that includes a first array of curved mirrors (first optical elements) 120F, and a second array of curved mirrors (first optical elements) 140F that are formed and cooperate in a manner similar to that described above. Note that first array of mirrors 120F are disposed on protrusions 214F formed on convex surface 212F, and the second array of mirrors 140F are disposed in indentations 218E that are integrally molded into curved surface 217F.

Figure 10B:
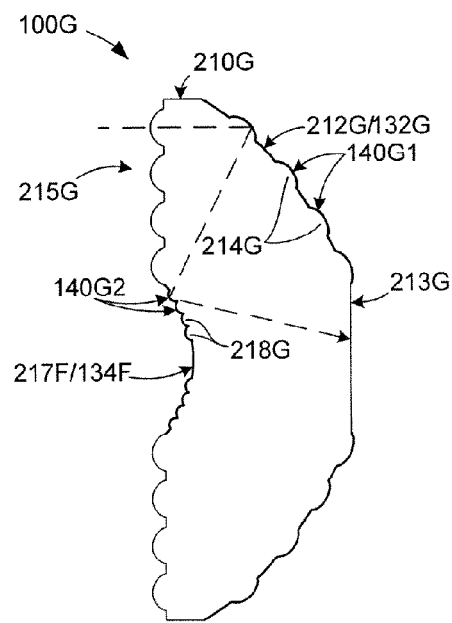

FIG. 10(B) shows a concentrating solar collector 100G including another optical structure 210G that includes an aperture surface 215G defining lenslets 120G, a first array of curved mirrors 140G1, and a second array of curved mirrors 140G2 that are formed and cooperate in a manner similar to that described above. Note that first array of mirrors 120G1 are disposed on protrusions 214G formed on convex surface 212G, and the second array of mirrors 140G2 are disposed in indentations 218E that are integrally molded into curved surface 217G.

Figure 11A:
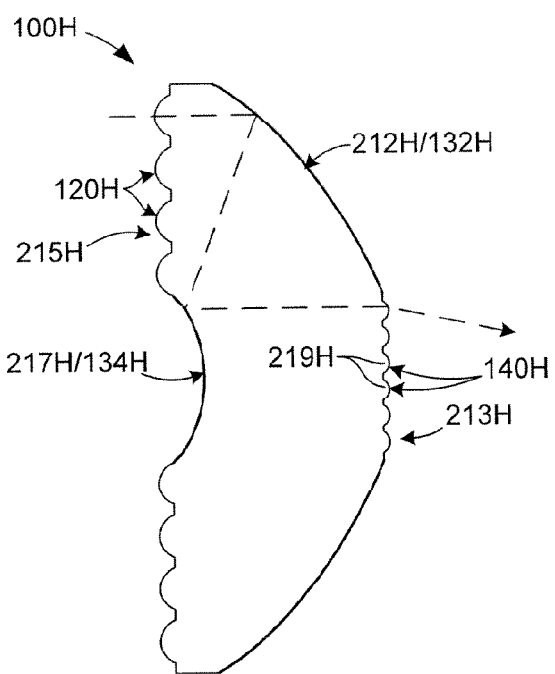

FIG. 11(A) shows a concentrating solar collector 100H including another optical structure 210H that includes an aperture surface 215H defining first lenslets 120H, and a second array of lenslets 140H formed on aperture surface 213H.

Figure 11B:
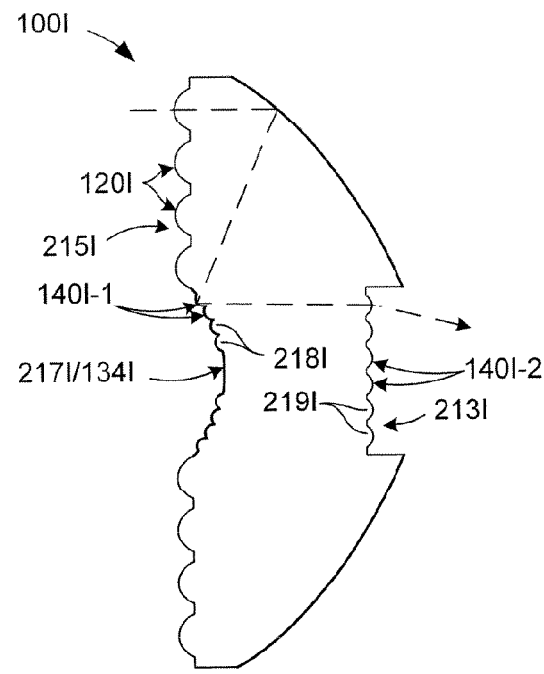
Figure 12:
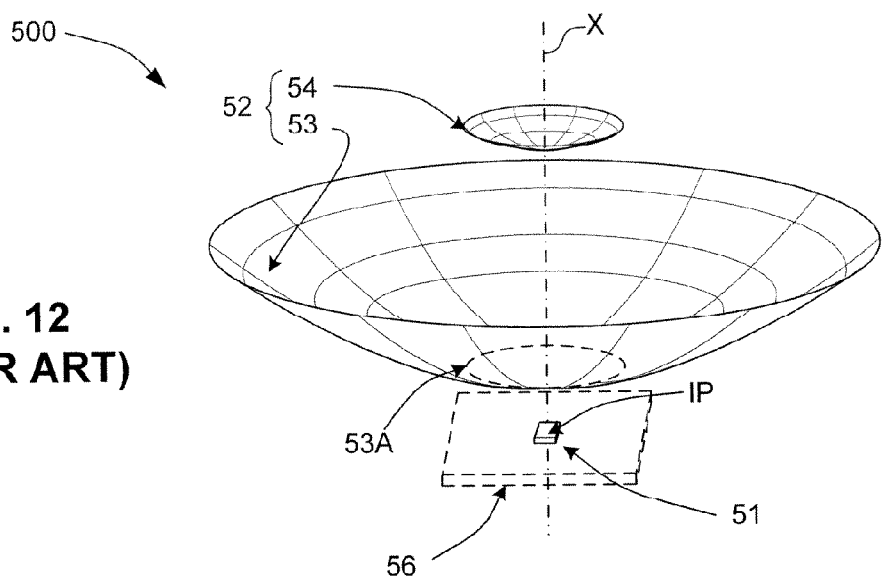
FIG. 12 is an exploded perspective view showing a conventional concentrating solar collector.
Figure 13:
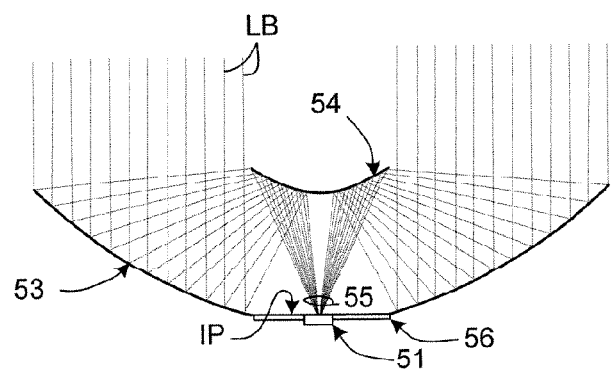
FIG. 13 is a cross-sectional side view showing the conventional concentrating solar collector of FIG. 12 during operation.
Figure 14:
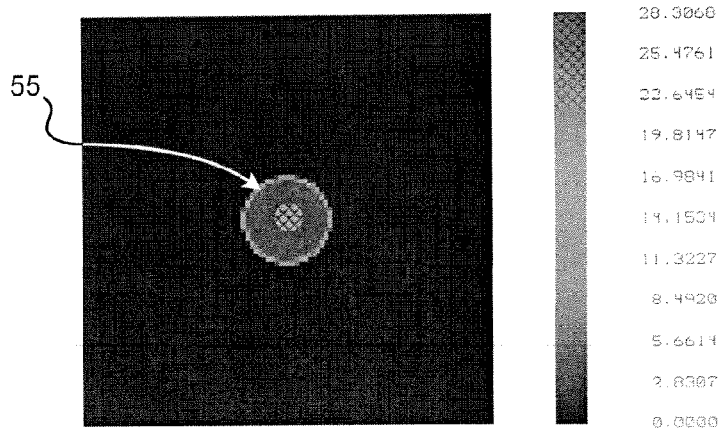
FIG. 14 is a photograph showing a circular irradiance light distribution generated by the conventional concentrating solar collector of FIG. 12.
Figure 15A:
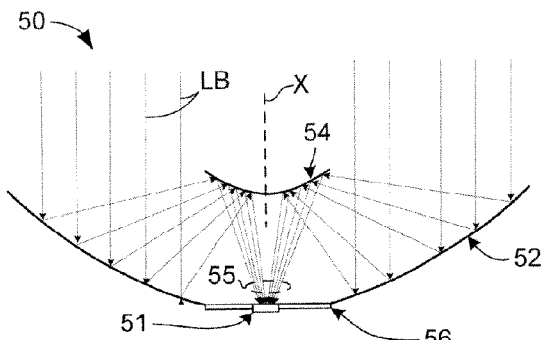
FIGS. 15(A), 15(B) and 15(C) are cross-sectional side views depicting the operation of the conventional concentrating solar collector cell of FIG. 12 in response to the various incident light angles.
Figure 16A:
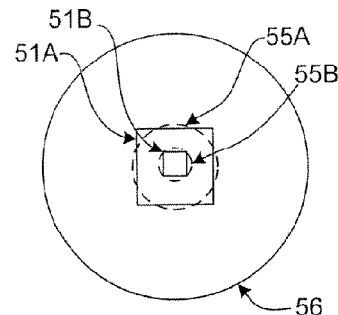
FIGS. 16(A), 16(B) and 16(C) are enlarged, top plan views depicting light distribution patterns formed on a PV cell in response to the various incident light angles depicted in FIGS. 15(A), 15(B) and 15(C), respectively.
Figure 15B:
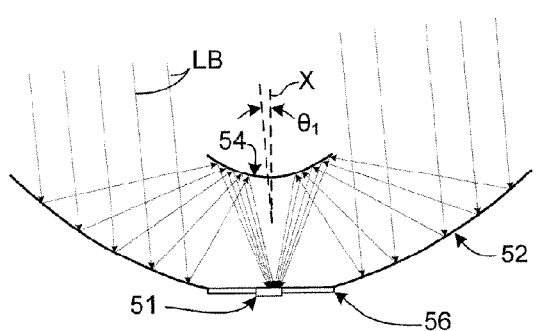
Figure 16B:
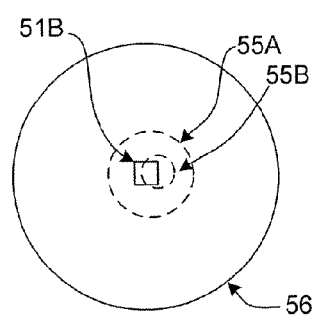
Figure 15C:
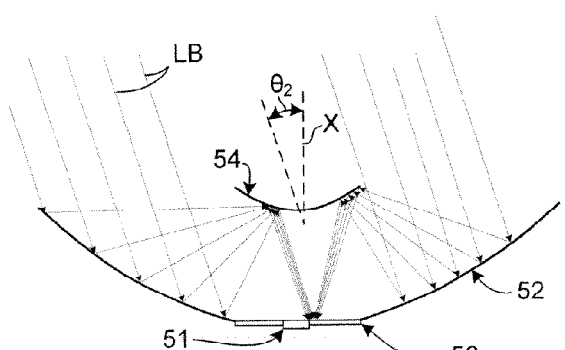
Figure 16C:
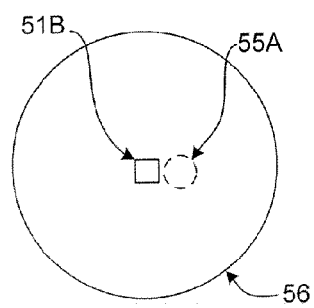

FIG. 11(B) shows a concentrating solar collector 100H including another optical structure 210I that includes an aperture surface 215I defining first lenslets 120I, an array of curved mirrors 140I-1 formed on curved surface 217I, and a second array of lenslets 140I-2 formed on an indented aperture surface 213H.

Although the present invention has been described with respect to certain specific embodiments, it will be clear to those skilled in the art that the inventive features of the present invention are applicable to other embodiments as well, all of which are intended to fall within the scope of the present invention. For example, some beneficial aspects of the invention may be achieved in a two-pane arrangement where the secondary mirror and secondary optical elements (e.g., lenslets 120) are formed on a first (front) pane and the primary mirror and secondary optical elements (e.g., mirrors 140D, see FIG. 9(A)) are formed on a second (back) pane in the manner described above. Although such an arrangement would benefit from, for example, utilization of the primary mirror films to provide string wiring, such an arrangement would require positioning of panes during assembly and increase maintenance costs. In another alternative embodiment, the primary and secondary mirrors and optical elements of the secondary optical system may be preformed and then mounted to the optical element using a suitable adhesive, but this approach may substantially increase production costs. In yet another alternative embodiment, the curved surface utilized to form the secondary mirror may be convex instead of concave, thus being in the form of a classical Gregorian type system. In yet another alternative embodiment, the curved surfaces utilized to form the primary and secondary mirrors, as well as the optical elements of the secondary optical system, may be elliptical, ellipsoidal, spherical, or other curved shape. In yet another alternative embodiment, the lenslets are formed on a flat or slightly curved substrate or surface and are tilted to direct the light onto the PV cell. In this case the function of the primary and secondary mirrors are subsumed by the lenslet or mirrorlet arrays. The advantage is that these types of surfaces may be easier to mold. Further, while the present invention is described herein in the context of a single concentrating solar collector, in a preferred embodiment the invention is utilized in an array of concentrating solar collectors formed and arranged in a manner similar to that disclosed in co-owned and co-pending U.S. patent application Ser. No. 11/110,611. Finally, the lenslets/mirrorlets in the arrays do not have to have the same shape.

The invention claimed is:

1. A concentrating solar collector apparatus including a photovoltaic (PV) cell defining an image plane and a solar collector optical system for concentrating solar light onto the PV cell, wherein the solar collector optical system comprises:
a plurality of first optical elements for dividing the solar light into a plurality of separate beams, wherein each of the plurality of first optical elements has an associated optical axis, wherein the associated optical axes of all of the plurality of optical elements are parallel, and wherein each optical element focuses an associated separate beam of said plurality of separate beams along its associated optical axis, and
a secondary optical system for integrating the plurality of separate beams such that the plurality of separate beams are superimposed on the PV cell in a defocused state,
wherein the plurality of first optical elements comprises an array of lenslets disposed in an aperture plane.

2. The concentrating solar collector apparatus according to claim 1, wherein each of the plurality of first optical elements defines a focal length, wherein the secondary optical system comprises a secondary optical element disposed at a distance equal to twice said focal length from the aperture plane, whereby the rays of each said separate beam are parallel between the second optical element and the image plane.

3. The concentrating solar collector apparatus according to claim 2, wherein the PV cell is disposed at a distance equal to said focal length from the second optical element.

4. The concentrating solar collector apparatus according to claim 2, further comprises a plurality of third optical elements, each third optical element being disposed at a distance equal to said focal length from both the second optical element and a corresponding first optical element.

5. The concentrating solar collector apparatus according to claim 1, wherein each lenslet comprises a curved upper surface that is truncated by four straight peripheral edges, thereby forming a square lenslet aperture.

6. The concentrating solar collector apparatus according to claim 1, wherein each lenslet comprises one of a hexagonal and a keystone-shaped lenslet aperture.

7. The concentrating solar collector apparatus according to claim 1, wherein the secondary optical system comprises a concave primary mirror and a convex secondary mirror that define a central optical axis $[X_0]$ and a primary focal point located on the central optical axis and a first region of the image plane.

8. The concentrating solar collector apparatus according to claim 7, each lenslet of the array of lenslets defines an associated optical axis that is parallel to the central optical axis and intersects the concave primary mirror.

9. The concentrating solar collector apparatus according to claim 7, further comprising a solid, light-transparent optical structure having a first side including a relatively large convex surface, a second side including a substantially flat first aperture surface defining the aperture plane, and a relatively small curved surface defined in a central portion of the aperture surface, wherein the primary mirror is disposed on the convex surface, and wherein the secondary mirror is disposed on the curved surface.

10. The concentrating solar collector apparatus according to claim 9, wherein the plurality of first optical elements comprises a plurality of lenslets disposed on the first aperture surface of the optical structure.

11. The solar collector according to claim 10, wherein the plurality of lenslets are integrally molded with the optical structure such that the plurality of lenslets protrude from the aperture surface.

12. The concentrating solar collector apparatus according to claim 9, wherein the optical structure comprises one of glass and plastic.

13. The concentrating solar collector apparatus according to claim 9, wherein each of the plurality of first optical elements comprises one of a spherical, conic, aspherical, cylindrical, toroidal, on-axis or off-axis sectioning, concave and convex surface shape.

14. The concentrating solar collector apparatus according to claim 9, wherein the primary mirror and secondary mirror comprise a first and second films of a reflective mirror material that is deposited onto the convex surface and the curved surface, respectively.

15. The concentrating solar collector apparatus according to claim 7, wherein each of the lenslets comprises a curved upper surface defining a secondary optical axis that is parallel to the central optical axis, wherein the curved upper surface is truncated by four straight peripheral edges, thereby forming a square lenslet aperture.

16. The concentrating solar collector apparatus according to claim 15, wherein the lenslets are arranged such that at least one said straight peripheral edge of each lenslet is shared with at least one adjacent lenslet.

17. The concentrating solar collector apparatus according to claim 16, further comprising a solid, light-transparent optical structure having a first side including a relatively large convex surface, a second side including a substantially flat first aperture surface defining the aperture plane, and a relatively small curved surface defined in a central portion of the aperture surface, wherein the primary mirror is disposed on the convex surface, and wherein the secondary mirror is disposed on the curved surface.

18. The concentrating solar collector apparatus according to claim 17, wherein the lenslets are integrally molded with the optical element such that the lenslets are disposed over an entirety of the first aperture surface.

19. The concentrating solar collector apparatus according to claim 1, further comprising a solid, light-transparent optical structure having a first side including a relatively large convex surface surrounding a rear aperture surface, a second side including a front aperture surface defining the aperture plane, and a relatively small curved surface defined in a central portion of the front aperture surface, wherein the secondary optical system comprises at least one of a concave primary mirror disposed on the convex surface and a convex secondary mirror disposed on the curved surface.

20. The concentrating solar collector apparatus according to claim 19, wherein the plurality of first optical elements comprises an array of lenslets disposed on the front aperture plane.

21. The concentrating solar collector apparatus according to claim 19, wherein the convex surface of the optical structure defines a plurality of protrusions, and wherein the concentrating solar collector apparatus further comprises a plurality of curved mirrors, each curved mirror being disposed on an associated said protrusion.

22. The concentrating solar collector apparatus according to claim 19, wherein the curved surface of the optical structure defines a plurality of indentations, and wherein the concentrating solar collector apparatus further comprises a plurality of curved mirrors, each curved mirror being disposed on an associated said indentation.

23. The concentrating solar collector apparatus according to claim 19, wherein the rear aperture surface comprises an array of lenslets.

* * * * *